United States Patent
Inoue et al.

(10) Patent No.: US 6,801,440 B2
(45) Date of Patent: Oct. 5, 2004

(54) MOUNTING STRUCTURE FOR MODULE SUBSTRATES

(75) Inventors: Keiji Inoue, Yokohama (JP); Yasuo Ohashi, Tokyo-to (JP); Toru Yoshikawa, Machida (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/995,643

(22) Filed: Nov. 29, 2001

(65) Prior Publication Data

US 2002/0131258 A1 Sep. 19, 2002

(30) Foreign Application Priority Data

Mar. 14, 2001 (JP) ........................................ 2001-072297

(51) Int. Cl.⁷ ............................... H05K 1/11; H05K 1/14
(52) U.S. Cl. ........................ 361/803; 361/790; 257/686
(58) Field of Search ......................... 361/790, 803–804, 361/735, 742, 758, 770, 772–774; 257/685–686, 691, 777–780, 723–724

(56) References Cited

U.S. PATENT DOCUMENTS

| | | | | |
|---|---|---|---|---|
| 4,437,235 A | * | 3/1984 | McIver | 174/52.2 |
| 5,191,404 A | * | 3/1993 | Wu et al. | 257/723 |
| 5,323,060 A | * | 6/1994 | Fogal et al. | 257/777 |
| 5,726,612 A | * | 3/1998 | Mandai et al. | 29/740 |
| 5,910,885 A | * | 6/1999 | Gulachenski et al. | 361/742 |
| 6,051,886 A | * | 4/2000 | Fogal et al. | 257/777 |
| 6,313,998 B1 | * | 11/2001 | Kledzik et al. | 257/686 |
| 6,333,562 B1 | * | 12/2001 | Lin | 257/777 |
| 6,472,758 B1 | * | 10/2002 | Glenn et al. | 257/777 |
| 6,531,784 B1 | * | 3/2003 | Shim et al. | 257/777 |

* cited by examiner

Primary Examiner—Luan Thai
Assistant Examiner—Tuan Dinh
(74) Attorney, Agent, or Firm—Keating & Bennett, LLP

(57) ABSTRACT

A plurality of module substrates have circuit boards, respectively. The circuit boards are stacked with a space therebetween, and are connected to first end portions of connecting members. The second end portions of the connecting members are connected to connecting pads disposed on a motherboard. The module substrates are thus stacked and mounted on the motherboard so as to increase the mounting density. By causing the connecting members for the upper circuit board to project further than the connecting members for the lower circuit board, the connecting members for the upper and lower circuit boards are prevented from touching each other.

18 Claims, 10 Drawing Sheets

MOUNTING STRUCTURE FOR MODULE SUBSTRATES

BACKGROUND OF THE INVENTION

1. Field of the Invention

The present invention relates to a structure for mounting module substrates having an electronic circuit, such as a DC-DC converter power-supply circuit, on a motherboard.

2. Description of the Related Art

FIG. 12 is a schematic side view showing an example of a module substrate mounting structure. A module substrate 49 includes a circuit board 45 with a circuit pattern (not shown) thereon, and circuit components 46 (for example, a transformer and an IC) mounted on the circuit pattern.

A circuit pattern (not shown) is formed on a motherboard 50, and circuit components (not shown) are mounted thereon. The circuit patterns of the module substrate 49 and the motherboard 50 are electrically connected to each other via connecting members 48.

An example of the module substrate is a DC-DC converter device. The DC-DC converter device converts input DC voltage and current into output DC voltage and current that satisfies specified requirements. A plurality of such DC-DC converter devices 49 are sometimes used in response to requests for output voltage and current conforming to the specified requirements. In this case, for example, a plurality of DC-DC converter devices 49 are arranged side by side with a space D therebetween on the motherboard 50 in consideration of heat radiation efficiency, as shown in FIG. 11. These DC-DC converter devices 49 are connected in parallel or in series by a wiring pattern 51 provided on the motherboard 50 according to the specifications.

However, in order to arrange a plurality of DC-DC converter devices 49 side by side such that the space D is provided therebetween, the motherboard 50 must have a large mounting area that is at least equal to the sum of the area corresponding to the number of the DC-DC converter devices and the area corresponding to the space D. For this reason, it is difficult to reduce the size of the motherboard 50.

SUMMARY OF THE INVENTION

In order to overcome the problems described above, preferred embodiments of the present invention provide a module substrate mounting structure which allows a plurality of module substrates to be mounted on a motherboard with very high density.

According to a first preferred embodiment of the present invention, a module substrate mounting structure includes a motherboard having connecting pads disposed on the surface thereof, and a plurality of module substrates each having connecting terminals provided on the surface thereof, wherein the module substrates are stacked with a space therebetween on the motherboard, the connecting terminals of the module substrates are electrically connected to the connecting pads on the motherboard via connecting members, a plurality of connecting terminals are arranged along an edge portion of each of the module substrates, the module substrates are stacked such that the connecting terminals aligned with each other, a plurality of connecting pads are arranged on the surface of the motherboard in the direction of arrangement of the connecting terminals, a plurality of rows of the connecting pads are arranged to be sequentially offset from one another from the inside of a region on the motherboard where the module substrates are mounted toward the outside thereof, the connecting terminals of an upper module substrate of the module substrates are electrically connected to the row of connecting pads on the outer side of the row of connecting pads connected to the connecting terminals of a lower module substrate via the connecting members, the length of the connecting members increases as the position of the module substrate connected thereto is higher, and the connecting members connected to the upper module substrate project further than the connecting members connected to the lower module substrate.

In this case, since a plurality of module substrates are stacked on the motherboard, the component mounting density on the motherboard is greatly increased, compared with the case in which a plurality of module substrates are placed side by side on the motherboard.

By making the lengths of the connecting members to be connected to a plurality of module substrates different, the module substrates can be stacked without using a substrate supporting member having a special shape. For this reason, it is possible to mount a plurality of module substrates on the motherboard with very high density and at low manufacturing cost without increasing the number of components and the number of manufacturing processes.

Furthermore, since the connecting members connected to the upper module substrate project further than the connecting members connected to the lower module substrate, it is possible to prevent the connecting members of a plurality of module substrates from touching one another even when the module substrates are stacked.

According to a second preferred embodiment of the present invention, a module substrate mounting structure includes a motherboard having connecting pads disposed on the surface thereof, and a plurality of module substrates each having connecting terminals provided on the surface thereof, wherein the module substrates are stacked with a space therebetween on the motherboard, the connecting terminals of the module substrates are electrically connected to the connecting pads on the motherboard via connecting members, a plurality of connecting terminals are arranged along an edge portion of each of the module substrates, the module substrates are stacked on the motherboard and are sequentially offset from one another in the direction of arrangement of the connecting terminals so that the edge portions with the connecting terminals disposed thereon are aligned with one another, and the connecting pads to be electrically connected to the connecting terminals of the module substrates via the connecting members are located in the same row.

In this case, since the module substrates are stacked while being offset from each other in the direction of arrangement of the connecting terminals, it is possible to prevent the connecting members of a plurality of module substrates from touching one another even when the module substrates are stacked. Moreover, since the connecting members of the upper module substrate and the connecting members of the lower module substrate are arranged in the same row, it is possible to equally and easily check the connecting state between the connecting members of the upper module substrate and the connecting pads and the connecting state between the connecting members of the lower module substrate and the connecting pads.

According to a third preferred embodiment of the present invention, a module substrate mounting structure includes a motherboard having connecting pads disposed on the surface thereof, and a plurality of module substrates each having connecting terminals disposed on the surface thereof, wherein the module substrates are stacked with a space therebetween on the motherboard, the connecting terminals of the module substrates are electrically connected to the connecting pads on the motherboard via connecting members, a plurality of connecting terminals are arranged along an edge portion of each of the module substrates, the module substrates are stacked on the motherboard and are sequentially offset from one another in the direction of arrangement of the connecting terminals so that the edge portions with the connecting terminals disposed thereon are aligned with one another, a plurality of connecting pads are arranged on the surface of the motherboard in the direction of arrangement of the connecting terminals, a plurality of rows of the connecting pads are arranged to be sequentially offset from one another from the inside of a region on the motherboard, where the module substrates are mounted, toward the outside thereof, the connecting terminals of an upper module substrate of the module substrates are electrically connected to a row of connecting pads on the outer side of a row of connecting pads connected to the connecting terminals of a lower module substrate via the connecting members, and the connecting members connected to the upper module substrate project further than the connecting members connected to the lower module substrate.

In this case, since the module substrates are stacked while being offset from each other in the direction of arrangement of the connecting terminals, it is possible to prevent the connecting members of a plurality of module substrates from touching one another even when the module substrates are stacked. Moreover, since the connecting pads corresponding to the connecting members of the module substrates are placed in separate rows, the area of the connecting pads can be increased, compared with the case in which the connecting pads are arranged in the same row, and the distance between the adjoining connecting pads can be increased. This makes it possible to facilitate the formation of the connecting pads, and to increase the width of the connecting members without having to be concerned about contact between the connecting members of the module substrates.

Preferably, a lower-substrate recognition mark is provided in a portion of the lower module substrate which is exposed because the upper module substrate is arranged in an offset manner. The lower-substrate recognition mark makes it easy to confirm whether or not the lower module substrate is mounted.

According to a fourth preferred embodiment of the present invention, a module substrate mounting structure includes a motherboard having connecting pads provided on the surface thereof, and a plurality of module substrates each having connecting terminals disposed on the surface thereof, wherein the module substrates are stacked with a space therebetween on the motherboard, the connecting terminals of the module substrates are electrically connected to the connecting pads on the motherboard via connecting members, a plurality of connecting terminals are arranged along a pair of edge portions of each of the module substrates, and the module substrates are stacked with the space therebetween on the motherboard so that the directions of arrangement of the connecting terminals of the upper and lower module substrates are nearly perpendicular to each other.

In this case, it is possible to prevent the connecting members of a plurality of module substrates from touching one another even when the module substrates are stacked.

Preferably, the module substrates have a nozzle suction area which is drawn by a component-transporting suction nozzle. This allows the module substrates to be transported by the suction nozzle in a reliable manner.

Preferably, the ratio of the length to width of the module substrates is within the range of about 1/3 to about 1/1. In this case, the module substrates can be transported in a stable manner by, for example, a suction nozzle. In particular, when the module substrates are stacked so that the directions of arrangement of the connecting terminals of the upper module substrate and the lower module substrate are nearly perpendicular to each other, the area of the overlapping portion therebetween can be increased by setting the ratio of the length to width within the above range.

Preferably, the module substrates have a converter power-supply circuit. When the module substrates have a converter power-supply circuit, a plurality of converter power-supply circuits are sometimes connected in series or in parallel for use. In such a case, a plurality of converter devices can be mounted in a region having an area substantially similar to that of a region for mounting a single converter device. That is, it is possible to mount a plurality of converter devices on the motherboard with high density, and to thereby reduce the size of the motherboard.

Further elements, characteristics, features, and advantages of the present invention will become apparent from the following description of preferred embodiments with reference to the attached drawings.

DETAILED DESCRIPTION OF PREFERRED EMBODIMENTS

Preferred embodiments of the present invention will be described below with reference to the attached drawings.

Figure 1A:
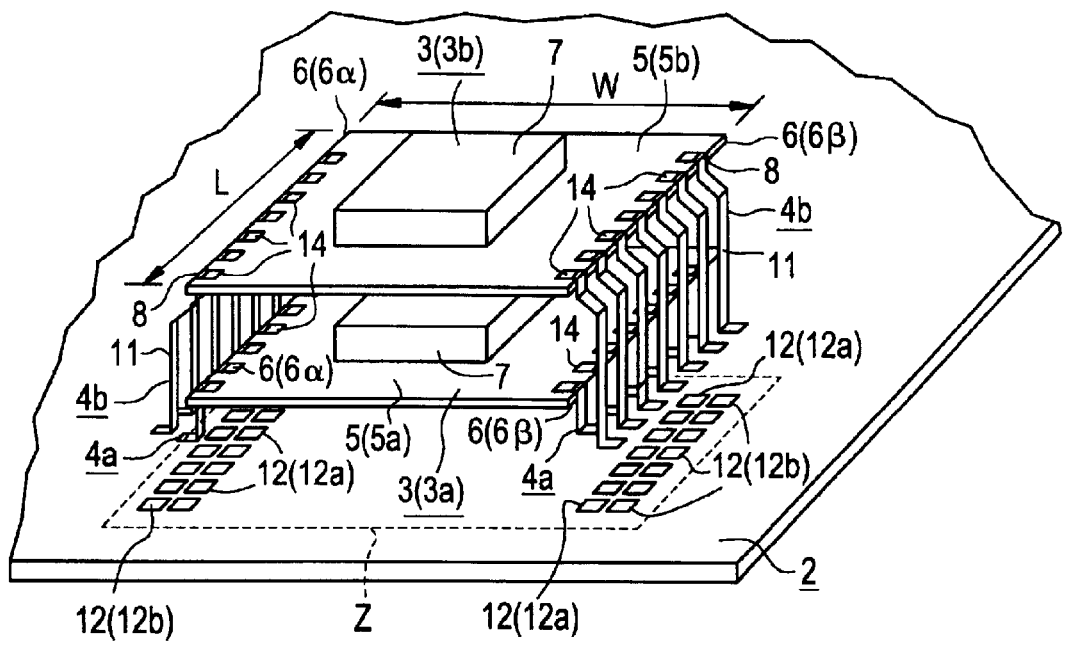
FIGS. 1A and 1B are schematic explanatory views of a module substrate mounting structure according to a first preferred embodiment of the present invention.
Figure 1B:
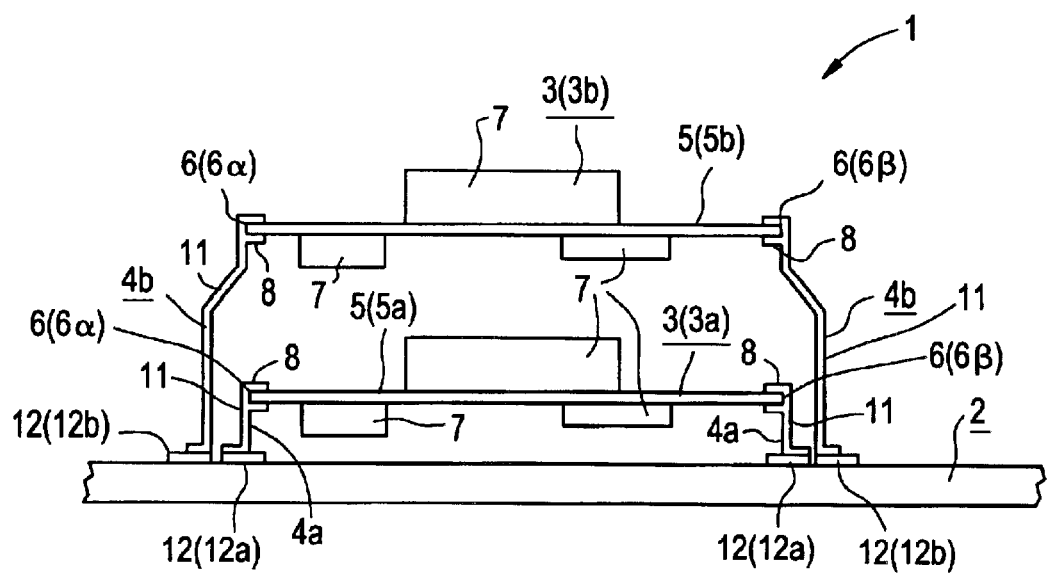

FIG. 1A is an exploded schematic perspective view of a module substrate mounting structure according to a first preferred embodiment of the present invention. FIG. 1B is a front view of the module substrate mounting structure shown in FIG. 1A as the perspective view.

In the first preferred embodiment, as an example, two module substrates 3a and 3b are mounted on a motherboard 2. The module substrate 3a preferably includes a plurality of connecting members 4a, a circuit board 5a, and a circuit component 7, such as a transformer or an IC, or other suitable electronic component. The module substrate 3b also includes a plurality of connecting members 4b, a circuit board 5b, and a circuit component 7, in a manner similar to that of the module substrate 3a.

Each of the circuit boards 5a and 5b has a circuit pattern (not shown), and a plurality of connecting terminals 14 connected to the circuit pattern. The connecting terminals 14 are preferably arranged at a substantially equal arrangement pitch along edge portions 6α and 6β on a pair of opposing sides of each of the circuit boards 5a and 5b. The circuit boards 5a and 5b are stacked with a space therebetween on the motherboard 2 while the connecting terminals 14 are aligned with each other.

The connecting members 4a support the lower circuit board 5a above the motherboard 2, and electrically connect the connecting terminals 14 of the lower circuit board 5a and connecting pads 12 disposed on the motherboard 2. Similarly, the connecting members 4b support the upper circuit board 5b above the motherboard 2, and electrically connect the connecting terminals 14 of the upper circuit board 5b and connecting pads 12 disposed on the motherboard 12.

Figure 2A:
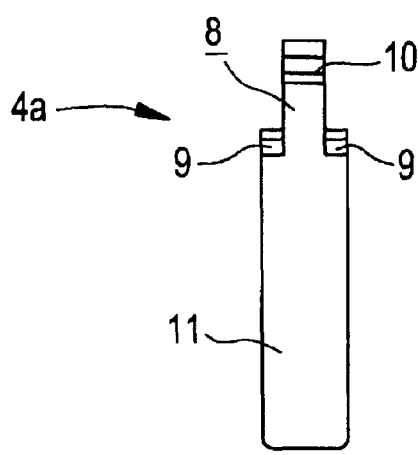
FIGS. 2A to 2D are explanatory views of examples of connecting members to be connected to module substrates.
Figure 2B:
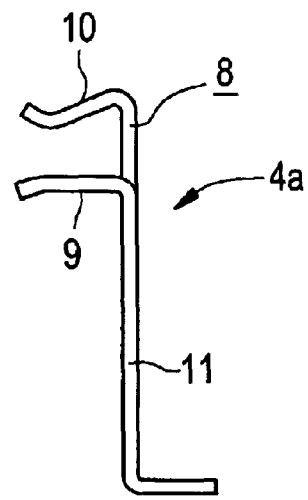
Figure 2C:
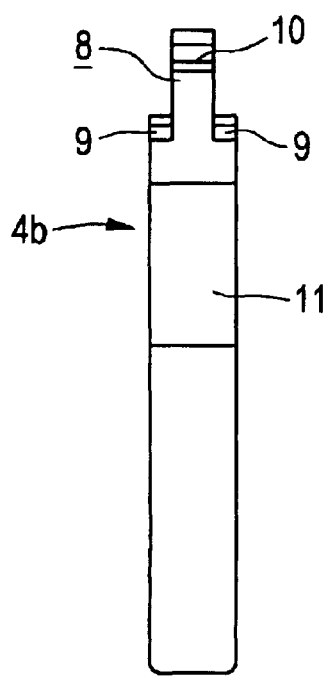
Figure 2D:
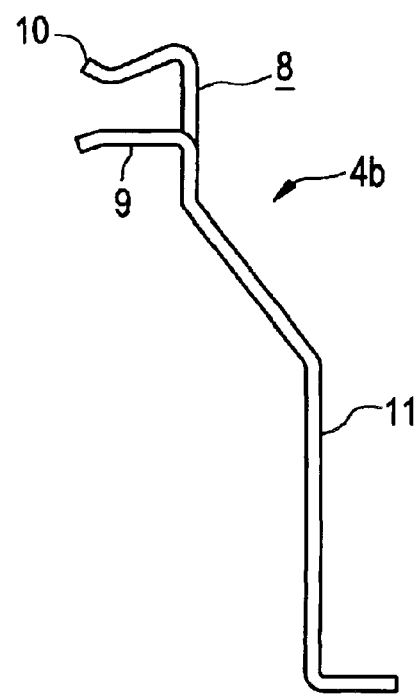

The connecting members 4a and 4b have a clip 8, and a leg portion 11, as shown in FIGS. 2B and 2D. Each clip 8 has a supporting portion 9 and a pressing portion 10. The supporting portion 9 makes contact with the rear surface of the circuit board 5 so as to support the circuit board 5. The pressing portion 10 applies a pressing force onto the front surface of the circuit board 5 by using elasticity. Such a clip 8 fixedly clamps an edge portion of the circuit board 5 where the connecting terminals 14 are located. FIG. 2A is a view of the connecting member 4a, as viewed from the approximate center of the circuit board 5, and FIG. 2C is a view of the connecting member 4b, as viewed from the approximate center of the circuit board 5.

The leg portion 11 of the connecting member 4b to be connected to the upper circuit board 5b is longer than that of the connecting member 4a to be connected to the lower circuit board 5a, and is bent in a projecting shape. The projecting shape makes it possible to prevent the connecting members 4b of the upper circuit board 5b from touching the connecting members 4a of the lower circuit board 5a.

Since the upper connecting members 4b have the leg portions 11 that are longer than those of the lower connecting members 4a, it is feared that mechanical strength thereof may decrease. In the first preferred embodiment, however, the upper connecting members 4b are bent, and therefore, have elasticity. For this reason, external forces resulting from, for example, the device being dropped or some other external force being applied, can be absorbed, and mechanical strength is greatly increased.

In order to produce the connecting members 4a and 4b, for example, a conductor plate having a length that is greater than the required length is prepared, and a clip 8 is formed by working one end of the conductor plate. The other end is cut to obtain the required length, and the leading end thereof is bent after cutting. In this case, the connecting member 4b is bent at the leading end, and is also worked into a projecting shape. In this way, the connecting members 4a and 4b can be produced in almost the same procedure.

Since the upper connecting members 4b project outwardly, the rows thereof are placed outside the rows of lower connecting members 4a. For this reason, the connecting pads 12 are formed on the motherboard 2 in the following manner. That is, rows of connecting pads 12a corresponding to the lower connecting members 4a are formed in the peripheral portion of a region Z on the motherboard 2 on which the circuit boards 5a and 5b are stacked and mounted. Outside the rows of connecting pads 12a, rows of connecting pads 12b corresponding to the upper connecting members 4b are provided. While a wiring pattern is connected to the connecting pads 12, it is not shown in FIG. 1A.

In order to mount the module substrates 3a and 3b on the motherboard 2, first, the circuit pattern and the connecting terminals 14 are patterned on the circuit board 5a, and the circuit component 7 is mounted thereon. The lower connecting members 4a are then attached to the circuit board 5a, thereby producing the lower module substrate 3a. Furthermore, by attaching the upper connecting members 4b to the circuit board 5b, the upper module substrate 3b is produced. The module substrates 3a and 3b are thus produced, and are stored in, for example, component trays, respectively.

Figure 3A:
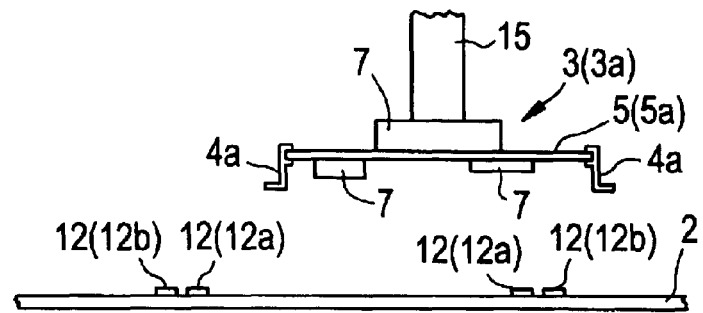
FIGS. 3A to 3C are explanatory views showing a process for transporting and mounting the module substrates onto a motherboard by using a suction nozzle.

Then, as shown in FIG. 3A, the lower module substrate 3a is drawn by a suction nozzle 15, and is transported toward a desired mounting position on the motherboard 2. The connecting members 4a of the module substrate 3a are aligned with the corresponding connecting pads 12 on the motherboard 2, and the lower module substrate 3a is placed on the motherboard 2. Subsequently, the leading ends of the connecting members 4a are connected to the connecting pads 12a by soldering. In this way, the lower module substrate 3a is surface-mounted on the motherboard 2.

Figure 3B:
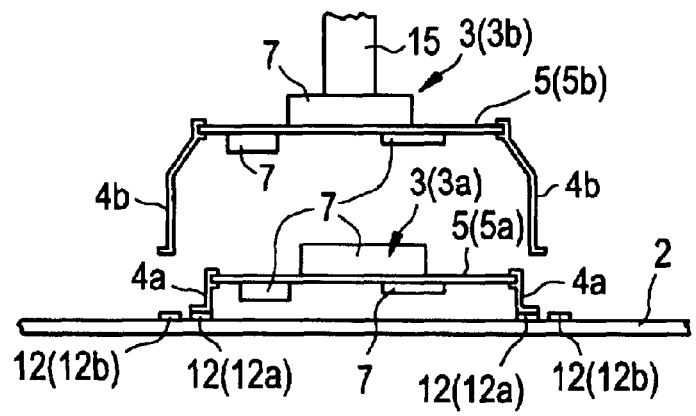
Figure 3C:
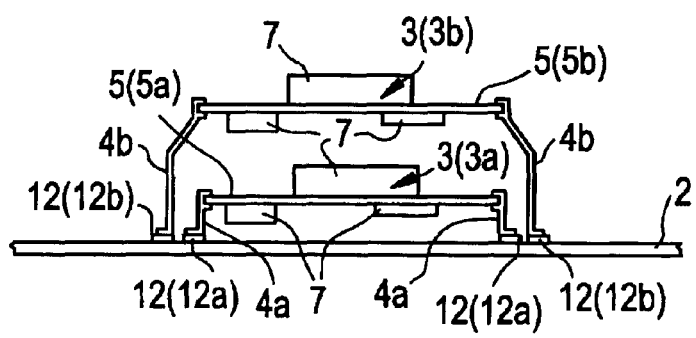

Next, as shown in FIG. 3B, the upper module substrate 3b is drawn by the suction nozzle 15, and is transported onto the motherboard 2, in a manner similar to the above. Then, the connecting members 4b of the upper module substrate 3b are connected to the corresponding connecting pads 12b by soldering, and the upper module substrate 3b is surface-mounted on the motherboard 2. In this way, a plurality of module substrates 3a and 3b are mounted on the motherboard 2, as shown in FIG. 3C.

In the first preferred embodiment, the module substrates 3a and 3b are not molded in order to reduce the thickness, and the circuit board 5, the circuit component 7, and other elements are exposed. For this reason, the front-side portion of the circuit board where the circuit component 7 is not mounted or the upper surface of the circuit component 7 functions as a suction area for the suction nozzle 15.

For example, in a case in which the module substrate 3 is an insulation type DC-DC converter device, the circuit board 5 is provided with a transformer. It is easy to provide the upper surface of the transformer with an area such that the transformer is drawn by the suction nozzle 15, and to make the surface flat. This allows the upper surface of the transformer to function as the nozzle suction area. In this case, the portion of the front side of the circuit board having no circuit component 7, which functions as the nozzle suction area, is unnecessary. This can prevent the component mounting density on the circuit board 5 from being decreased.

When the upper surface of the transformer functions as the nozzle suction area, it is preferable that the transformer be placed at the center of gravity of the module substrate 3 so that the module substrate 3 can be transported in a state in which the weight balance is ensured. For example, in a case in which the exposed front-side portion of the circuit board 5 where the circuit component 7 is not mounted functions as the nozzle suction area, it is preferable that the exposed front-side portion of the circuit board 5 be located at the center of gravity of the module substrate 3.

In the first preferred embodiment, the ratio of the length L to the width W of the circuit boards 5a and 5b is preferably within the range of about 1/3 to about 1/1 so that the module substrates 3a and 3b can be transported in a stable state.

Figure 4:
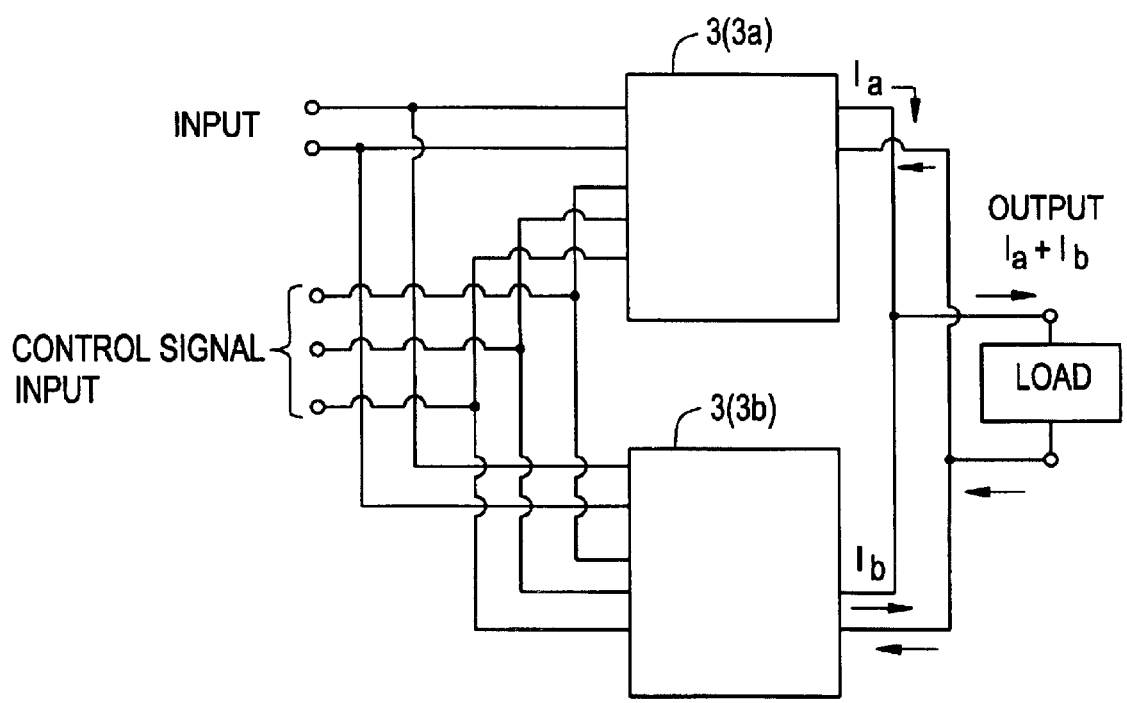
FIG. 4 is a circuit diagram showing a case in which a plurality of converter devices defining the module substrates are connected in parallel.
Figure 5:
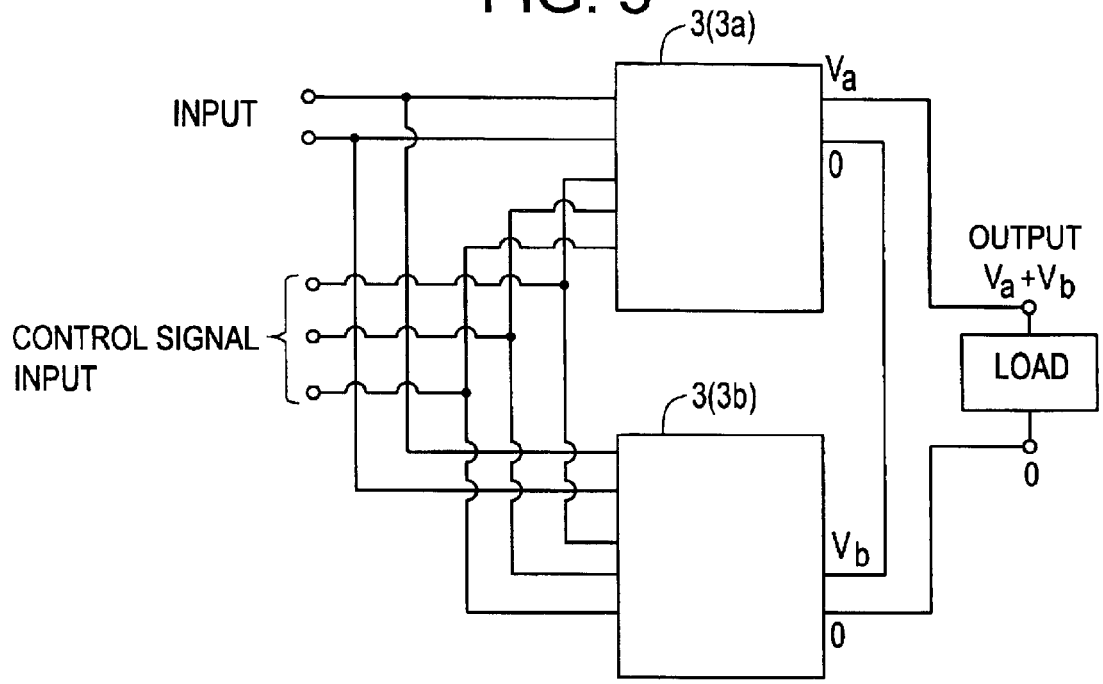
FIG. 5 is a circuit diagram showing a case in which a plurality of converter devices defining the module substrates are connected in series.
Figure 6:
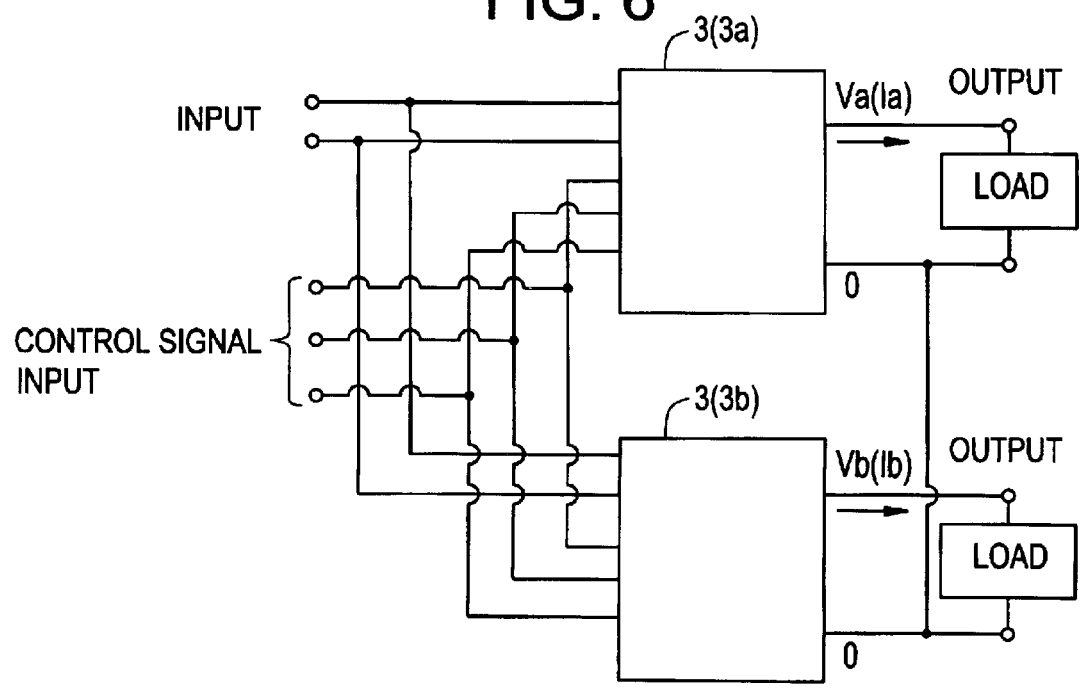
FIG. 6 is a circuit diagram showing a case in which a plurality of converter devices defining the module substrate are connected in a high output state.

In a case in which the module substrates 3a and 3b each define a DC-DC converter device, they may be connected in manners shown in FIGS. 4, 5, and 6 as circuit diagrams according to the wiring pattern (not shown) disposed on the motherboard 2.

In FIG. 4, the module substrates 3a and 3b are connected in parallel. In this case, for example, an output current Ia of the lower module substrate 3a and an output current Ib of the upper module substrate 3b are combined, that is, a current (Ia+Ib) is supplied to the load.

In FIG. 5, the module substrates 3a and 3b are connected in series. In this case, for example, the sum (Va+Vb) of an output voltage Va of the lower module substrate 3a and an output voltage Vb of the upper module substrate 3b is supplied to the load.

In FIG. 6, the module substrates 3a and 3b are connected to corresponding loads, respectively, and are connected in parallel. In this case, the module substrates 3a and 3b supply output voltages Va and Vb or output currents Ia and Ib to the corresponding loads.

A second preferred embodiment of the present invention will be described below.

Figure 7A:
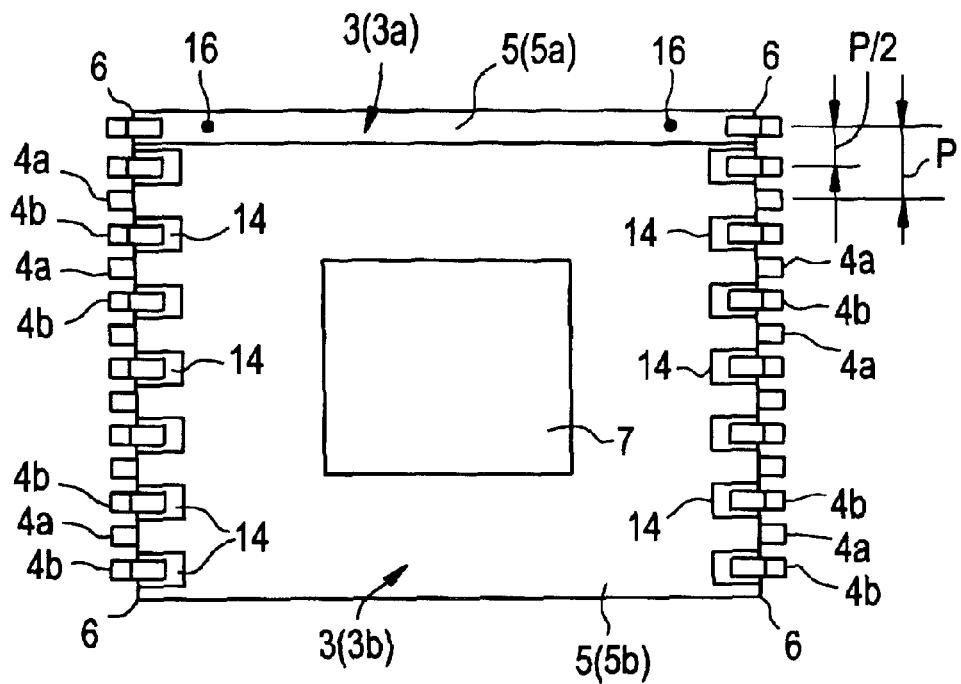
FIGS. 7A and 7B are schematic explanatory views of a module substrate mounting structure according to a second preferred embodiment of the present invention.
Figure 7B:
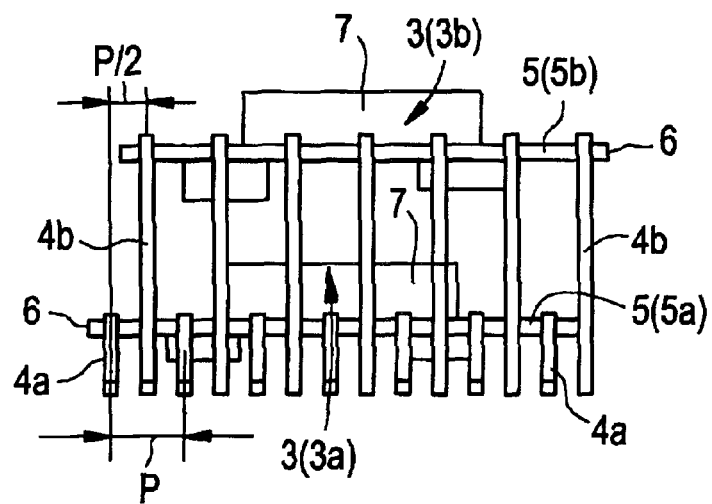

FIG. 7A is a schematic top view showing a module substrate mounting structure according to the second preferred embodiment. FIG. 7B is a side view of the module substrate mounting structure shown in FIG. 7A. In the following description of the second preferred embodiment, the same components as those in the first preferred embodiment are denoted by the same reference numerals, and redundant descriptions thereof are omitted.

In the second preferred embodiment, a lower circuit board 5a and an upper circuit board 5b are stacked while being offset from each other in the direction of arrangement of connecting terminals 14. The offset distance between the lower circuit board 5a and the upper circuit board 5b is preferably almost half the array pitch P (P/2) of the connecting terminals 14 (connecting members 4). Arranging the lower circuit board 5a and the upper circuit board 5b to be offset from each other in this manner prevents lower connecting members 4a from touching upper connecting members 4b.

Figure 8:
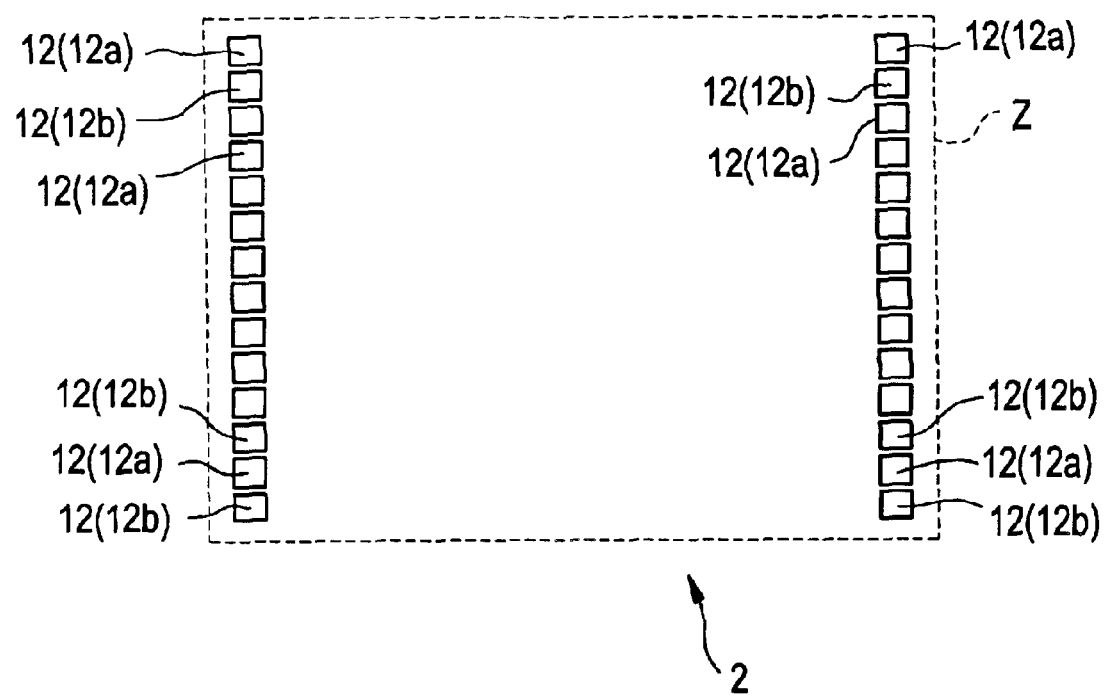
FIG. 8 is an explanatory view showing an example of forming connecting pads on a motherboard in the second preferred embodiment of the present invention.

Since the circuit boards 5a and 5b are arranged to be offset from each other, the lower connecting members 4a and the upper connecting members 4b are alternately arranged in the same row. For this reason, as shown in FIG. 8, connecting pads 12a for the connecting members 4a and connecting pads 12b for the connecting members 4b are alternately arranged in the same row in the peripheral portion of a region Z on a motherboard 2 where the circuit boards 5a and 5b are stacked and mounted.

Since the connecting pads 12a and 12b are thus arranged in the same row, the soldering state between the lower connecting members 4a and the connecting pads 12a, and the soldering state between the upper connecting members 4b and the connecting pads 12b can be checked easily.

Due to the layered arrangement of the module substrates 3a and 3b, the lower module substrate 3a is hidden beneath the upper module substrate 3b. This makes it difficult to confirm whether or not the lower module substrate 3a is mounted. In the second preferred embodiment, however, since the circuit boards 5a and 5b are arranged to be offset from each other, a portion of the lower module substrate 3a is exposed without being hidden beneath the upper module substrate 3b. Consequently, it is easier to confirm whether or not the lower module substrate 3a is mounted, than in the first preferred embodiment of the present invention.

In addition, in the second preferred embodiment, lower-substrate recognition marks 16 are provided on an exposed portion of the lower circuit board 5a which is not hidden beneath the upper circuit board 5b, as shown in FIG. 7A. The use of the lower-substrate recognition marks 16 makes easier to confirm whether or not the lower module substrate 3a is mounted.

A third preferred embodiment of the present invention will be described below. In the following description of the third preferred embodiment, the same components as those in the above-described preferred embodiments are denoted by the same reference numerals, and redundant descriptions thereof are omitted.

In the second preferred embodiment, the connecting pads 12a for the lower connecting members 4a and the connecting pads 12b for the upper connecting members 4b are arranged in the same row on the motherboard 2. For that purpose, it is necessary to reduce the area of the connecting pads 12 and to substantially reduce the distance between the adjoining connecting pads 12. In this case, it may be quite difficult to pattern the connecting pads 12, depending on the size of the module substrate 3.

Figure 9A:
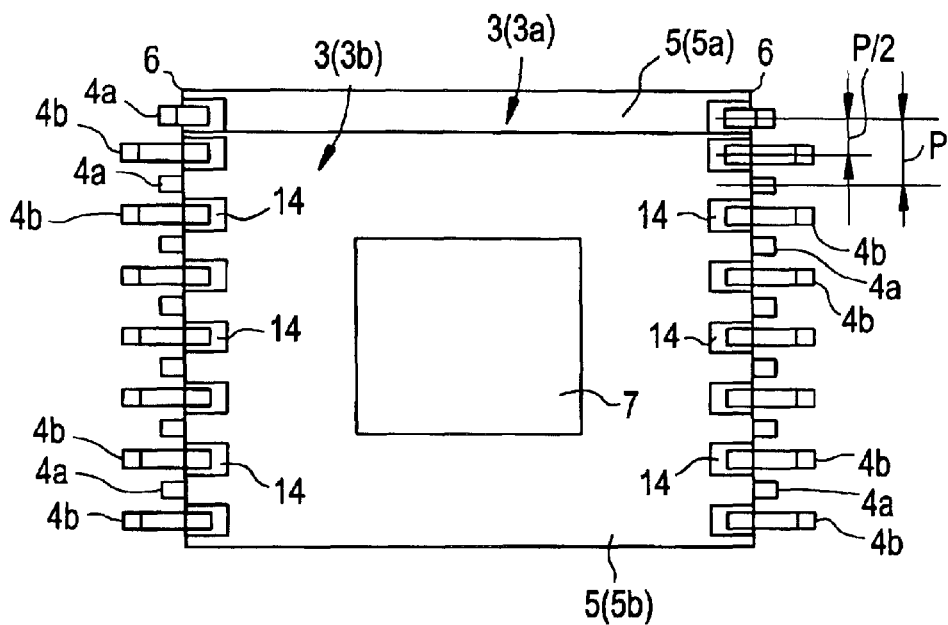
FIGS. 9A and 9B are explanatory views showing a module substrate mounting structure according to a third preferred embodiment of the present invention.

The module substrate mounting structure of the third preferred embodiment can overcome this problem. FIG. 9A is a schematic top view of a mounting structure for module substrates 3a and 3b in the third preferred embodiment of the present invention. In the third preferred embodiment, a lower circuit board 5a and an upper circuit board 5b are stacked and arranged to be offset from each other in the direction of arrangement of connecting terminals 14, in a manner similar to that of the second preferred embodiment, and upper connecting members 4b project further than lower connecting members 4a, in a manner similar to that of the first preferred embodiment.

Figure 9B:
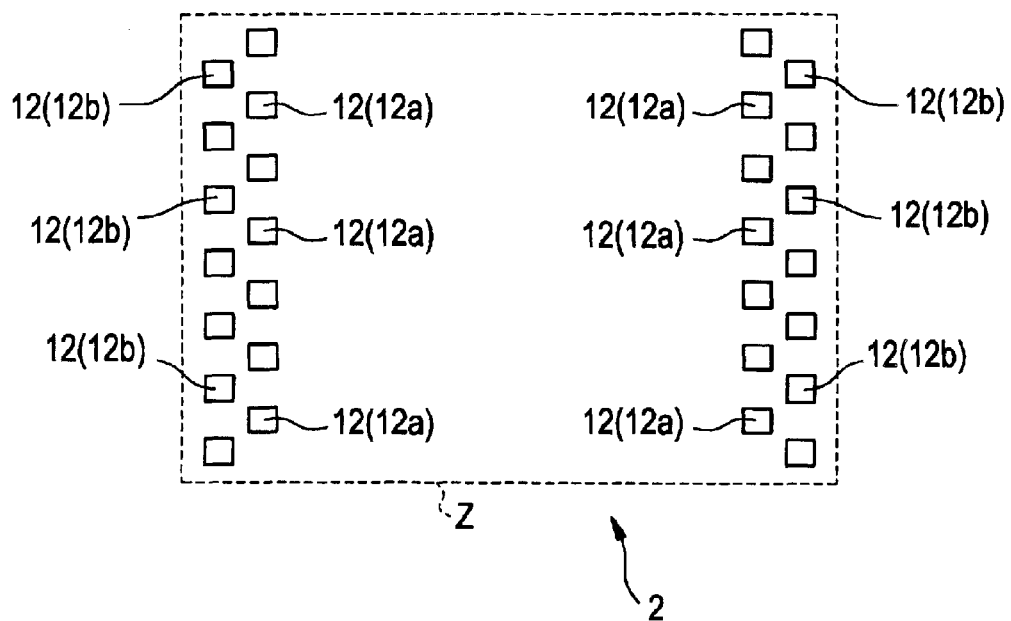

As shown in FIG. 9B, rows of connecting pads 12a corresponding to the lower connecting members 4a are arranged in the peripheral portion of a region Z on a motherboard 2 where the circuit boards 5a and 5b are stacked and mounted. Outside the connecting pads 12a, rows of connecting pads 12b corresponding to the upper connecting members 4b are provided.

While the lower circuit board 5a in FIG. 9A has no lower-substrate recognition mark as described in the second preferred embodiment, a lower-substrate recognition mark may be located in an exposed portion of the lower circuit board 5a, in a manner similar to that of the second preferred embodiment.

A fourth preferred embodiment of the present invention will be described below. In the following description of the fourth preferred embodiment, the same components as those in the above preferred embodiments are denoted by the same reference numerals, and redundant descriptions thereof are omitted.

Figure 10A:
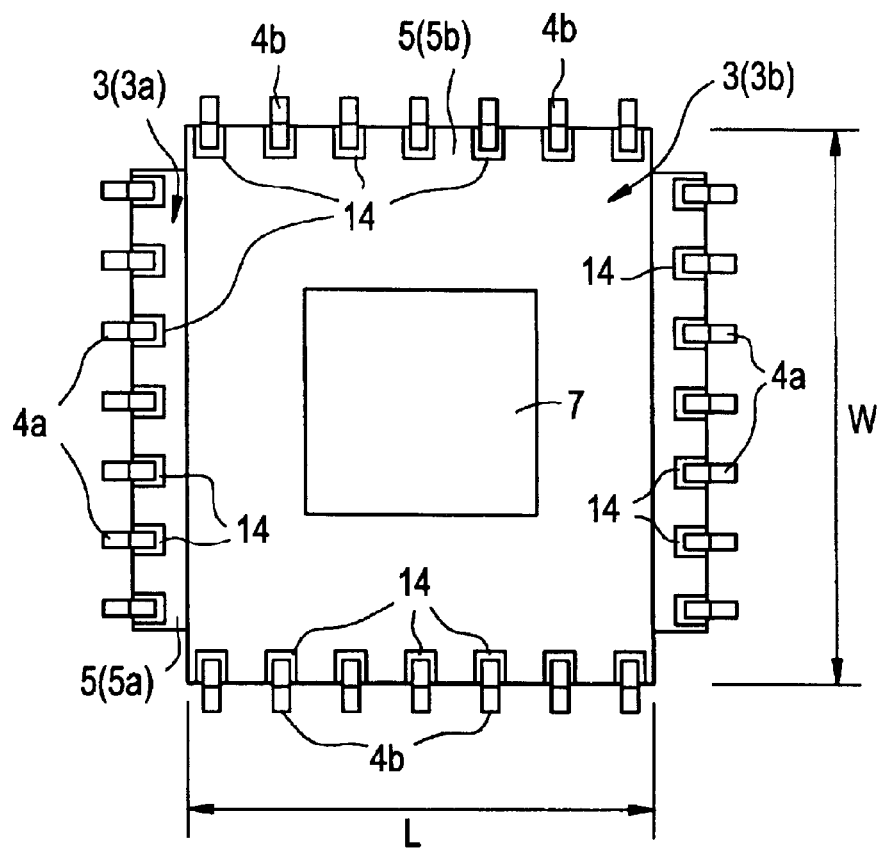
FIGS. 10A and 10B are explanatory views showing a module substrate mounting structure according to a fourth preferred embodiment of the present invention.
Figure 10B:
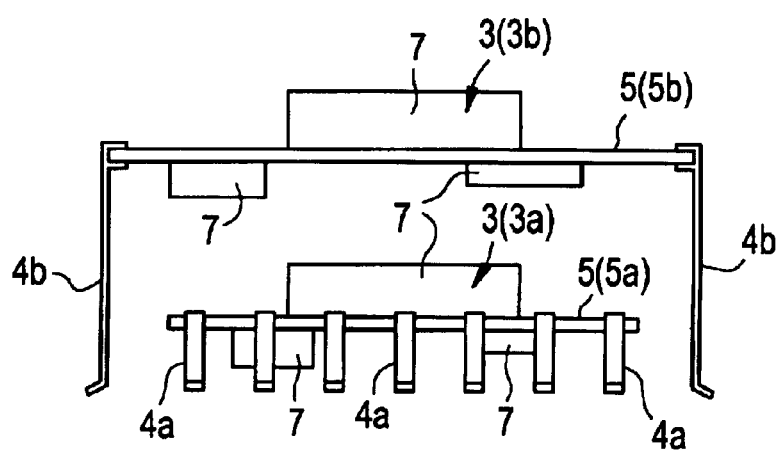
Figure 11:
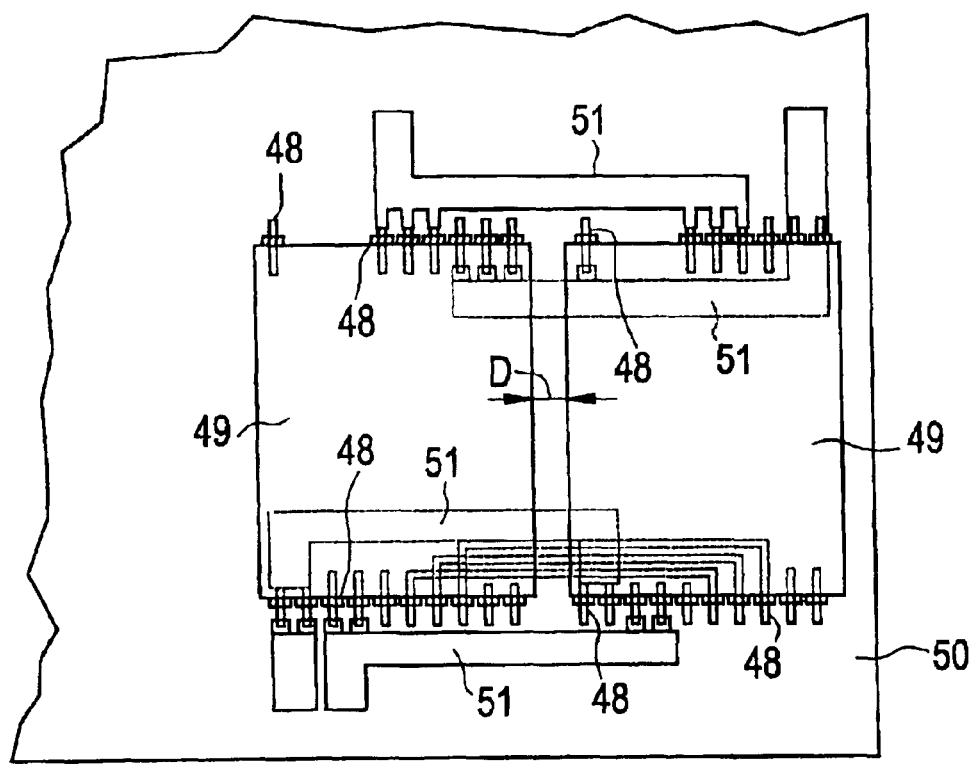
FIG. 11 is an explanatory view showing a conventional example in which a plurality of module substrates are mounted on a motherboard.
Figure 12:
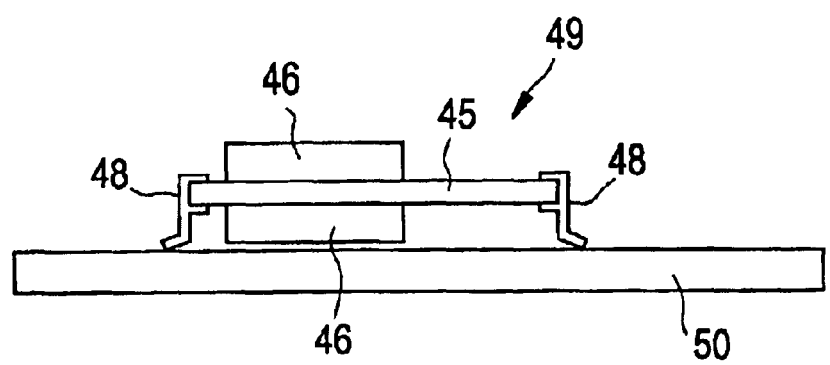
FIG. 12 is a model view showing an example of a module substrate.

FIG. 10A is a schematic top view showing a module substrate mounting structure according to the fourth preferred embodiment. FIG. 10B is a side view of the module substrate mounting structure shown in FIG. 10A.

In the fourth preferred embodiment, circuit boards 5a and 5b of module substrates 3a an 3b are stacked so that the directions of arrangement of connecting terminals 14 of the lower circuit board 5a and connecting terminals 14 of the upper circuit board 5b are nearly perpendicular to each other.

In this structure, lower connecting members 4a are not hidden beneath upper connecting members 4b. Therefore, it is possible to equally and easily check the soldering state between the lower connecting members 4a and the connecting pads 12a and the soldering state between the upper connecting members 4b and the connecting pads 12b.

In the fourth preferred embodiment, the ratio of the length L to the width W of the circuit boards 5a and 5b is preferably within the range of about 1/3 to about 1/1, in a manner similar to that of the above-described preferred embodiments. This makes it possible to transport the module substrates 3a and 3b in a stable manner.

In the case in which the circuit boards 5a and 5b are elongated so that the ratio of the length L to the width W is outside of the range of about 1/3 to about 1/1, the area of the overlapping portion between the lower circuit board 5a and the upper circuit board 5b is decreased. In this case, even when the module substrates 3a and 3b are mounted on the motherboard 2 while the circuit boards 5a and 5b are stacked, an increase in component mounting density on the motherboard 2 cannot be achieved.

In contrast, by setting the ratio of the length L to the width W of the circuit board 5 within the range of about 1/3 to about 1/1, the area of the overlapping portion between the lower circuit board 5a and the upper circuit board 5b can be prevented from decreasing. Consequently, it is possible to effectively increase the component mounting density on the motherboard 2.

The present invention is not limited to the above-described preferred embodiments, and various modifications are possible. For example, while two module substrates 3a and 3b are mounted in the above-described preferred embodiments, the present invention is also applicable to a case in which three or more module substrates are mounted, and this can further increase the mounting density on the motherboard 2.

While a DC-DC converter is described as an example of the module substrate 3 in the above-described preferred embodiments, the present invention is also applicable to a module substrate mounting structure having a circuit configuration other than a DC-DC converter power-supply circuit. While the circuit boards 5a and 5b in the preferred embodiments have the same circuit configuration, the present invention is also applicable to a case in which a plurality of types of module substrates having different circuit configurations are mounted on the motherboard. When a plurality of module substrates 3 are converter devices, for example, a converter device with an output voltage of 3V and a converter device with an output voltage of 5V may be mounted on the motherboard so that the circuit boards are stacked as in the above-described preferred embodiments. In this way, the module substrates defining converter devices having different output values may be mounted as in the preferred embodiments described herein.

The shapes of the connecting members 4a and 4b are not specifically limited. It is satisfactory as long as the connecting members 4a and 4b have shapes that support the circuit board 5 above the surface of the motherboard 2 and to electrically connect the connecting terminals 14 of the circuit board 5 and the connecting pads 12 of the motherboard 2.

While the upper connecting members 4b are bent to have a projecting configuration in the first and third preferred embodiments, they may be rounded instead.

The lower circuit board 5a and the upper circuit board 5b preferably have substantially equal sizes in the above-described preferred embodiments. However, the circuit boards 5a and 5b may have different sizes, for example, circuit boards 5a and 5b having different lengths L between the edge portions 6α and 6β may be stacked.

While a plurality of connecting terminals 14 are preferably arranged along each of the edge portions 6α and 6β of the circuit boards 5a and 5b in the first preferred embodiment, a plurality of connecting terminals 14 may be arranged along all four sides of the circuit board 5. In this case, the upper connecting members 4b are also projected further than the lower connecting members 4a. This can prevent the lower connecting members 4a and the upper connecting members 4b from touching each other.

While the offset distance between the lower circuit board 5a and the upper circuit board 5b is preferably approximately half the array pitch P (P/2) of the connecting terminals 14 (connecting members 4) in the second and third preferred embodiments, it is not limited thereto as long as it allows the lower connecting members 4a and the upper connecting members 4b to be mounted without touching each other.

In the case in which a plurality of substrates are stacked so that the directions of arrangement of the connecting terminals of the lower module substrate and the upper module substrate are nearly perpendicular to each other, as described in the fourth preferred embodiment, when the number of module substrates is three or more, and connecting members to be connected to the upper module substrate and connecting members to be connected to a module substrate disposed below the upper module substrate with one module substrate therebetween are aligned, the connecting members for the upper module substrate are projected further than the connecting members for the module substrate disposed below the upper module substrate with one module substrate therebetween, as in the first preferred embodiment. The connecting members for the upper module substrate and the connecting members for the module substrate disposed below the upper module substrate with one module substrate therebetween may be prevented from touching each other by such a structure.

While the present invention has been described with reference to what are presently considered to be preferred embodiments, it is to be understood that the invention is not limited to the disclosed preferred embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A module substrate mounting structure comprising:
   a motherboard having connecting pads disposed on a surface thereof; and
   a plurality of module substrates each having connecting members attached to a surface thereof via connecting terminals disposed on each of said plurality module substrates; wherein said plurality of module substrates are stacked with a space therebetween on said motherboard, said connecting members of said plurality of module substrates are electrically connected to said connecting pads on said motherboard, a plurality of said connecting members are arranged along an edge portion of each of said plurality of module substrates, said plurality of module substrates are stacked with said connecting members aligned with each other, a plurality of said connecting pads are arranged on the surface of said motherboard in the direction of arrangement of said connecting members, a plurality of rows of said connecting pads are arranged to be sequentially offset from one another from an inner region of said motherboard where said module substrates are mounted toward an outer region of said motherboard, said connecting members of an upper module substrate of said plurality of module substrates are electrically connected to an outer row of connecting pads and said connecting members of a lower module substrate are electrically connected to an inner row of connecting pads disposed inwardly of said outer row of connecting pads, the length of said connecting members increases as the position of respective ones of said plurality of module substrates connected thereto is higher, and said connecting members connected to said upper module substrate project further from said upper module substrate than said connecting members connected to said lower module substrate.

2. A module substrate mounting structure according to claim 1, wherein said plurality of module substrates have a nozzle suction area that is arranged to be drawn by a component-transporting suction nozzle.

3. A module substrate mounting structure according to claim 1, wherein a ratio of a length to a width of each of said plurality of module substrates is within a range of about 1/3 to about 1/1.

4. A module substrate mounting structure according to claim 1, wherein said plurality of module substrates have a converter power-supply circuit.

5. A module substrate mounting structure comprising:
   a motherboard having connecting pads disposed on a surface thereof; and
   a plurality of module substrates each having connecting members attached to a surface thereof via connecting terminals disposed on each of said plurality of module substrates; wherein
   said plurality of module substrates are stacked with a space therebetween on said motherboard;
   said connecting members of said plurality of module substrates are electrically connected to said connecting pads on said motherboard;
   a portion of said connecting terminals is arranged along a first edge portion of each of said plurality of module substrates;
   said plurality of module substrates are stacked on a surface of said motherboard and are sequentially offset from one another in the direction parallel to the surface of said motherboard;
   said first edge portions of each of said plurality of module substrates with said portion of said connecting terminals disposed thereon are aligned with one another in the direction perpendicular to the surface of said motherboard; and
   a portion of said connecting pads connected to said portion of said connecting terminals arranged along the first edge portion of each of said plurality of module substrates via said connecting members is arranged in the same row.

6. A module substrate mounting structure according to claim 5, wherein a lower substrate recognition mark is located on an exposed portion of a lower module substrate of said plurality of module substrates.

7. A module substrate mounting structure according to claim 5, wherein said plurality of module substrates have a nozzle suction area that is arranged to be drawn by a component-transporting suction nozzle.

8. A module substrate mounting structure according to claim 5, wherein a ratio of a length to a width of each of said plurality of module substrates is within a range of about 1/3 to about 1/1.

9. A module substrate mounting structure according to claim 5, wherein said plurality of module substrates have a converter power-supply circuit.

10. A module substrate mounting structure comprising:
    a motherboard having connecting pads disposed on a surface thereof; and
    a plurality of module substrates each having connecting members attached to a surface thereof via connecting terminals disposed on each of said plurality of module substrates; wherein
    said plurality of module substrates are stacked with a space therebetween on said motherboard, said connecting members of said plurality of module substrates are electrically connected to said connecting pads on said motherboard, a plurality of said connecting terminals are arranged along an edge portion of each of said plurality of module substrates, said plurality of module substrates are stacked on said motherboard and are sequentially offset from one another in the direction of arrangement of said connecting terminals so that said edge portions with said connecting terminals disposed thereon are aligned with one another in a stacking direction, a plurality of said connecting pads are arranged on the surface of said motherboard in the direction of arrangement of said connecting terminals, a plurality of rows of said connecting pads are arranged to be sequentially offset from one another from an inner region on said motherboard where said plurality of module substrates are mounted toward an outer region of said motherboard, said connecting members of an upper module substrate of said module substrates are electrically connected to an outer row of said plurality of rows of connecting pads and said connecting members of a lower module substrate are electrically connected to an inner row of connecting pads disposed inwardly of said outer row of connecting pads, and said connecting members connected to said upper module substrate project further from said upper module substrate than said connecting members connected to said lower module substrate.

11. A module substrate mounting structure according to claim 10, wherein a lower substrate recognition mark is located on an exposed portion of said lower module substrate.

12. A module substrate mounting structure according to claim 10, wherein said plurality of module substrates have a nozzle suction area that is arranged to be drawn by a component-transporting suction nozzle.

13. A module substrate mounting structure according to claim 10, wherein a ratio of a length to a width of each of said plurality of module substrates is within a range of about 1/3 to about 1/1.

14. A module substrate mounting structure according to claim 10, wherein said plurality of module substrates have a converter power-supply circuit.

15. A module substrate mounting structure comprising:

a motherboard having connecting pads disposed on a surface thereof; and a plurality of module substrates each having connecting members attached to a surface thereof via connecting terminals disposed on each of said plurality of module substrates; wherein said connecting members of said plurality of module substrates are electrically connected to said connecting pads on said motherboard;

a plurality of said connecting terminals are arranged along a pair of edge portions of each of said plurality of module substrates; and said plurality of module substrates is stacked so that there is a space between an entire overlapping portion of adjacent module substrates and is arranged so that the direction of arrangement of said connecting terminals of an upper module substrate of said plurality of module substrates is substantially perpendicular to the direction of arrangement of said connecting terminals of a lower module substrate of said plurality of module substrates.

16. A module substrate mounting structure according to claim 15, wherein said plurality of module substrates have a nozzle suction area that is arranged to be drawn by a component-transporting suction nozzle.

17. A module substrate mounting structure according to claim 15, wherein a ratio of a length to a width of each of said plurality of module substrates is within a range of about 1/3 to about 1/1.

18. A module substrate mounting structure according to claim 15, wherein said plurality of module substrates have a converter power-supply circuit.

* * * * *